(12) United States Patent
Aliman et al.

(10) Patent No.: US 12,276,916 B2
(45) Date of Patent: Apr. 15, 2025

(54) DRIVE DEVICE, OPTICAL SYSTEM AND LITHOGRAPHY APPARATUS

(71) Applicant: Carl Zeiss SMT GmbH, Oberkochen (DE)

(72) Inventors: Michel Aliman, Oberkochen (DE); Matthias Manger, Aalen-Unterkochen (DE); Lars Berger, Aalen-Unterkochen (DE); Mohammad Awad, Heidenheim (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 121 days.

(21) Appl. No.: 17/961,447

(22) Filed: Oct. 6, 2022

(65) Prior Publication Data

US 2023/0047921 A1    Feb. 16, 2023

Related U.S. Application Data

(63) Continuation of application No. PCT/EP2021/060624, filed on Apr. 23, 2021.

(30) Foreign Application Priority Data

Apr. 27, 2020    (DE) .......................... 102020205279.4

(51) Int. Cl.
*G03F 7/00* (2006.01)
*G02B 7/182* (2021.01)
(Continued)

(52) U.S. Cl.
CPC ......... *G03F 7/70266* (2013.01); *G02B 7/182* (2013.01); *G02B 26/0833* (2013.01); *H02N 2/062* (2013.01); *G02B 5/0891* (2013.01)

(58) Field of Classification Search
CPC . G03F 7/70266; G02B 7/182; G02B 26/0833; H02N 2/062
See application file for complete search history.

(56) References Cited

U.S. PATENT DOCUMENTS 10,838,307 B2 *   11/2020   Holz .................... G03F 7/70491
10,983,443 B2 *   4/2021    Krone .................. H10N 30/802
(Continued)

FOREIGN PATENT DOCUMENTS

CN         101221356 A       7/2008
DE    10 2016 226 082 A1    6/2018
(Continued)

OTHER PUBLICATIONS

International Search Report and Written Opinion for corresponding PCT Appl No. PCT/EP2021/060624, dated Jul. 29, 2021.
(Continued)

*Primary Examiner* — Hung V Nguyen
(74) *Attorney, Agent, or Firm* — Fish & Richardson P.C.

(57) ABSTRACT

A drive device includes: a drive unit configured to apply a drive voltage to a capacitive actuator to set a position of a capacitive actuator; a source controllable by an excitation signal and coupled to the first node to feed a time-dependent AC current signal into the first node so that an AC voltage arises at the capacitive actuator due to a superposition of the drive voltage and an AC voltage corresponding to a product of the AC current signal and an impedance of the capacitive actuator; a filter unit connected configured to filter an output signal of the capacitive actuator; and a determining unit configured to determine an impedance behaviour of the capacitive actuator depending on the filtered output signal, the determining unit configured to output the excitation signal to drive the source.

20 Claims, 15 Drawing Sheets

(51) Int. Cl.
    *G02B 26/08*     (2006.01)
    *H02N 2/06*     (2006.01)
    *G02B 5/08*     (2006.01)

(56) References Cited

U.S. PATENT DOCUMENTS

| | | | |
|---|---|---|---|
| 2009/0110787 | A1 | 4/2009 | Kyle et al. |
| 2015/0277233 | A1 | 10/2015 | Shoot et al. |
| 2018/0188656 | A1 | 7/2018 | Bihr et al. |
| 2019/0179233 | A1 | 6/2019 | Butler et al. |
| 2019/0346772 | A1 | 11/2019 | Holz et al. |

FOREIGN PATENT DOCUMENTS

| | | |
|---|---|---|
| EP | 2 906 994 A1 | 8/2015 |
| JP | 2012-514863 A | 6/2012 |
| JP | 2015-511320 A | 4/2015 |
| JP | 2018-005037 A | 1/2018 |
| JP | 2018-528070 A | 9/2018 |
| JP | 2019-501514 A | 1/2019 |
| WO | WO 2009/110787 A1 | 4/2009 |

OTHER PUBLICATIONS

Korean Office Action, with translation thereof, for corresponding KR Appl No. 10-2022-7040398, dated Sep. 5, 2024.
Notice of Allowance, with translation thereof, for corresponding JP Appl No. 2022-564002, dated Jul. 25, 2023.
EPO Communication pursuant to Rules 161(1) and 162 for corresponding EP Appl No. 21722389.0, dated Dec. 6, 2022.
Response to EPO Communication pursuant to Rules 161(1) and 162 for corresponding EP Appl No. 21722389.0, dated May 24, 2023.
Jiacheng Zhang et al., "Electrical impedance behaviour of carbon fibre reinforced cement-based sensors at different moisture contents," *Construction and Building Materials* 353 (2022) 129049.
Matteo Saveriano et al., "Learning Motion and Impedance Behaviors from Human Demonstrations," The 11th International Conference on Ubiquitous Robots and Ambient Intelligence (URAI 2014), Nov. 12-15, 2014.
J. Rahola, "Bandwidth potential and electromagnetic isolation: Tools for analysing the impedance behaviour of antenna systems," *2009 3rd European Conference on Antennas and Propagation*, Berlin, Germany, 2009, pp. 944-948.
T. Wimbock, C. Ott and G. Hirzinger, "Impedance Behaviors for Two-handed Manipulation: Design and Experiments," *Proceedings 2007 IEEE International Conference on Robotics and Automation*, Rome, Italy, 2007, pp. 4182-4189, doi: 10.1109/ROBOT.2007.364122.
Taiwan Office Action and Search Report, with translation thereof, for corresponding Appl No. 110114905, dated Nov. 28, 2024.

\* cited by examiner

DRIVE DEVICE, OPTICAL SYSTEM AND LITHOGRAPHY APPARATUS

CROSS-REFERENCE TO RELATED APPLICATIONS

The present application is a continuation of, and claims benefit under 35 USC 120 to, international application PCT/EP2021/060624, filed Apr. 23, 2021, which claims benefit under 35 USC 119 of German Application No. 10 2020 205 279.4, filed Apr. 27, 2020. The entire disclosure of these applications are incorporated by reference herein.

FIELD

The present disclosure relates to a drive device for driving an actuator of an optical system, to an optical system comprising such a drive device, and to a lithography apparatus comprising such an optical system.

BACKGROUND

Microlithography apparatuses are known which have actuatable optical elements, such as, for example, microlens element arrays or micromirror arrays. Microlithography is used for producing microstructured components, such as, for example, integrated circuits. The microlithography process can be performed using a lithography apparatus, which has an illumination system and a projection system. The image of a mask (reticle) illuminated via the illumination system is in this case projected via the projection system onto a substrate, for example a silicon wafer, which is coated with a light-sensitive layer (photoresist) and arranged in the image plane of the projection system, in order to transfer the mask structure to the light-sensitive coating of the substrate. The imaging of the mask on the substrate can be improved via actuatable optical elements. By way of example, wavefront aberrations during exposure, which result in magnified and/or unsharp imagings, can be compensated for.

Such correction via the optical element can involve detecting the wavefront and signal processing in order to determine a respective position of an optical element which enables the wavefront to be corrected as desired. The last step can involve amplifying the drive signal for a respective optical element and to output it to the actuator of the optical element.

By way of example, a PMN actuator (PMN; lead magnesium niobate) can be used as actuator. A PMN actuator can allow distance positioning in the sub-micrometre range or sub-nanometre range. In this case, the actuator, having actuator elements stacked one on top of another, can experience a force that causes a specific linear expansion as a result of a DC voltage being applied. The position set by way of the DC voltage (DC; Direct Current) can be adversely influenced by external electromechanical crosstalk at the fundamentally arising resonance points of the actuator driven by the DC voltage. Owing to this electromechanical crosstalk, precise positioning may no longer be possible to set in a stable manner. In this case, the mechanical resonances can be all the greater the higher the applied DC voltage. The resonance points may also change in the long term, for example as a result of temperature drift or as a result of adhesive drift if the mechanical linking of the adhesive material changes, or as a result of hysteresis or ageing. An impedance measurement could be helpful in this context.

However, conventional impedance measuring devices are often too cost-intensive and furthermore do not have an inline capability, that is to say that they are regularly not able to be used in a lithography apparatus. Furthermore, integrated impedance measuring bridges, which are usually designed for excessively high impedance values, can prove not to be suitable for the present application in a lithography apparatus since the impedance value range of interest here encompasses a plurality of orders of magnitude and the range of interest is only a fraction of the total range.

SUMMARY

The present disclosure seeks to improve the driving of an actuator of an optical system.

In accordance with a first aspect, a drive device for driving a capacitive actuator of an optical system is proposed. The drive device comprises:
  a drive unit for applying a drive voltage to the actuator for setting a specific position of the driven actuator, wherein the drive unit and the actuator are coupled via a first node,
  a source controlled by an excitation signal and coupled to the first node, for feeding a time-dependent AC current signal into the first node in such a way that a specific AC voltage arises at the actuator as a result of the superposition of the drive voltage and an AC voltage corresponding to a product of the AC current signal and the impedance of the actuator,
  a filter unit connected to the output of the actuator and serving for filtering an output signal of the actuator, and
  a determining unit coupled to an output of the filter unit and configured to determine an impedance behaviour of the actuator depending on the filtered output signal and to output at its output the drive signal for driving the source.

The actuator is, for example, a PMN actuator (PMN; lead magnesium niobate) or a PZT actuator (PZT; lead zirconate titanate). The actuator is configured, for example, to actuate an optical element of the optical system. Examples of such an optical element include lens elements, mirrors and adaptive mirrors.

The present drive device can allow a fast determination, with an inline capability, of the impedance behaviour of the actuator, for example an impedance measurement of the actuator installed in the lithography apparatus.

On the basis of the determined impedance behaviour of the actuator, suitable remedies or countermeasures, for example an active inline calibration or inline damping, can also be implemented via the drive signal and a corresponding AC current signal fed in at the first node.

In accordance with some embodiments, the source comprises a signal generator controlled by the excitation signal, and a current or voltage source controlled by an output signal of the controlled signal generator for outputting the time-dependent AC current signal.

In accordance with some embodiments, the determining unit is configured to determine the transfer function of a section between the output of the signal generator and the output of the filter unit, wherein the section comprises the controlled current or voltage source, the first node, the actuator and the filter unit to determine an inverse of the determined transfer function, and to generate the drive signal using the calculated inverse.

The inverse can also be referred to as an inverse transfer function. As an alternative to the inverse transfer function, it is also possible to use some other transformation of the transfer function which can cause the resonance points of the actuator in order to be able to determine them optimally.

In accordance with some embodiments, the transfer function is a frequency-dependent signal transfer function of the drive signal embodied as a time-dependent excitation voltage and of the filtered output signal embodied as a complex excitation response voltage.

In accordance with some embodiments, the filter unit is embodied as a high-pass filter for providing a high-pass-filtered output signal.

Optionally, the determining unit can then determine the impedance behaviour of the actuator depending on the high-pass-filtered output signal.

In accordance with some embodiments, a peak-to-peak detector connected downstream of the high-pass filter and an output stage connected downstream of the peak-to-peak detector for providing at least one narrowband partial output signal are provided, wherein the determining unit is configured to carry out a broadband determination of the impedance behaviour of the actuator on the basis of the high-pass-filtered output signal and/or to carry out a narrowband determination of the impedance behaviour of the actuator on the basis of the at least one narrowband partial output signal.

An inverse Fourier transformation, for example, can be used in the broadband determination of the impedance behaviour of the actuator. For this reason, the broadband determination of the impedance behaviour by the determining unit can also be referred to as an IFT mode (IFT; Inverse Fourier Transformation). Narrow frequency bands can be examined or scanned very accurately in the narrowband determination of the impedance behaviour. For this reason, the narrowband determination of the impedance behaviour by the determining unit can also be referred to as a scanning mode.

In accordance with some embodiments, the determining unit is configured to generate the drive signal depending on the determined impedance behaviour of the actuator in such a way that the specific AC voltage arising at the actuator has an amplitude that is constant over the frequency.

The specific AC voltage having the amplitude that is constant over the frequency can allow for relatively precise positioning of the optical element to be actuated is possible.

In accordance with some embodiments, the drive device is configured to control, by open-loop control, the specific AC voltage arising at the actuator to the amplitude that is constant over the frequency using the drive signal.

In accordance with some embodiments, the drive device is configured to control, by closed-loop control, the specific AC voltage arising at the actuator to the amplitude that is constant over the frequency using the drive signal.

Depending on the application, the specific AC voltage can be controlled to the amplitude that is constant over the frequency by open-loop or closed-loop control. Suitable active inline damping measures are made possible as a result.

In accordance with some embodiments, the drive unit comprises a DC voltage source. Furthermore, an input resistance is coupled between the DC voltage source and the first node.

In accordance with some embodiments, the source comprises a controllable voltage or current source. Moreover, a coupling capacitance is connected between the voltage or current source and the first node.

In accordance with some embodiments, the drive device is configured to drive a plurality N of capacitive actuators of the optical system. In this case, an optical element of the optical system can be assigned to each actuator. By way of example, N=100.

In accordance with some embodiments, the respective actuator is assigned a respective drive unit for applying a drive voltage to the actuator for setting a specific position of the driven actuator and a respective filter unit connected to the output of the actuator and serving for filtering an output signal of the actuator. In this case, the determining unit can be coupled to the output of the respective filter unit and is configured to determine the impedance behaviour of the respective actuator depending on the respective filtered output signal and to output at its output the drive signal for the respective actuator.

The determining unit can for example select the actuator to be measured, for example by way of a number of switches that can be driven by the determining unit. For example, the determining unit is configured to drive the switches, to drive the drive units, to calculate the excitation signals and to sample the outputs of the filter units. The determining unit is embodied as an SPU (Signal Processing Unit), for example.

In this case, the excitation signal can be an excitation signal calculated via the inverse Fourier transformation (IFT stimulus). In this case, the IFT stimulus can be calculated from a predefined excitation frequency profile, wherein a suitably chosen excitation profile can increase the sensitivity of the impedance measurement, for example by way of a frequency response chosen deliberately to be flat in the vicinity of a resonant frequency.

In accordance with some embodiments, the respective first node is connectable to the source via a respective controllable switch. In this case, the determining unit can be configured, for the purpose of determining the impedance behaviour of a specific actuator of the plurality of actuators, to drive the drive unit assigned to the specific actuator and the switch assigned to the specific actuator.

The respective unit, for example the determining unit, can be implemented in terms of hardware technology and/or else in terms of software technology or as a combination of the two. In the case of an implementation in terms of hardware technology, the respective unit can be embodied as a device or as part of a device, for example as a computer or as a microprocessor. In the case of an implementation in terms of software technology, the respective unit or a part of the unit can be embodied as a computer program product, as a function, as a routine, as an independent process, as part of a program code and/or as an executable object.

In accordance with some embodiments, an optical system comprising a number of actuatable optical elements is proposed. Each of the actuatable optical elements of the number can be assigned an actuator and each actuator is assigned a drive device for driving the actuator in accordance with the first aspect or one of the embodiments of the first aspect.

The optical system comprises, for example, a micromirror array and/or a microlens element array having a multiplicity of optical elements that are actuatable independently of one another.

In embodiments, groups of actuators can be defined, wherein all actuators of a group are assigned the same drive device.

In accordance with some embodiments, a lithography apparatus comprising an optical system in accordance with the second aspect is proposed.

A lithography apparatus comprises an illumination system and an imaging system, for example. The illumination system comprises, for example, a light source and a beam-shaping optical unit. The imaging system comprises, for example, an imaging optical unit for imaging the mask onto the substrate.

The optical system can be used in the illumination system, in the beam-shaping optical unit, and also in the imaging system. In some embodiments, the optical system is embodied as a microlens element array or a micromirror array and serves for example for wave-front correction in the imaging system.

The lithography apparatus is for example an EUV lithography apparatus, the working light of which is in a wavelength range of 0.1 nm to 30 nm, or a DUV lithography apparatus, the working light of which is in a wavelength range of 30 nm to 250 nm.

Optionally, the lithography apparatus additionally comprises a measuring system configured for detecting a wavefront and configured for outputting a correction signal for correcting the wavefront via the optical system. The correction signal can serve for example as the input signal for the drive device.

"A(n); one" in the present case should not necessarily be understood as restrictive to exactly one element. Rather, a plurality of elements, such as, for example, two, three or more, can also be provided. Any other numeral used here, too, should not be understood to the effect that there is a restriction to exactly the stated number of elements. Rather, numerical deviations upwards and downwards are possible, unless indicated to the contrary.

Further possible implementations of the disclosure also comprise not explicitly mentioned combinations of features or embodiments that are described above or below with respect to the exemplary embodiments. In this case, a person skilled in the art will also add individual aspects as improvements or supplementations to the respective basic form of the disclosure.

Further features, configurations and aspects of the disclosure are the subject matter of the dependent claims and also of the exemplary embodiments of the disclosure described below. In the text that follows, the disclosure is explained in more detail on the basis of embodiments with reference to the accompanying figures.

DETAILED DESCRIPTION

Identical elements or elements having an identical function have been provided with the same reference signs in the figures, unless indicated to the contrary. It should also be noted that the illustrations in the figures are not necessarily true to scale.

Figure 1:
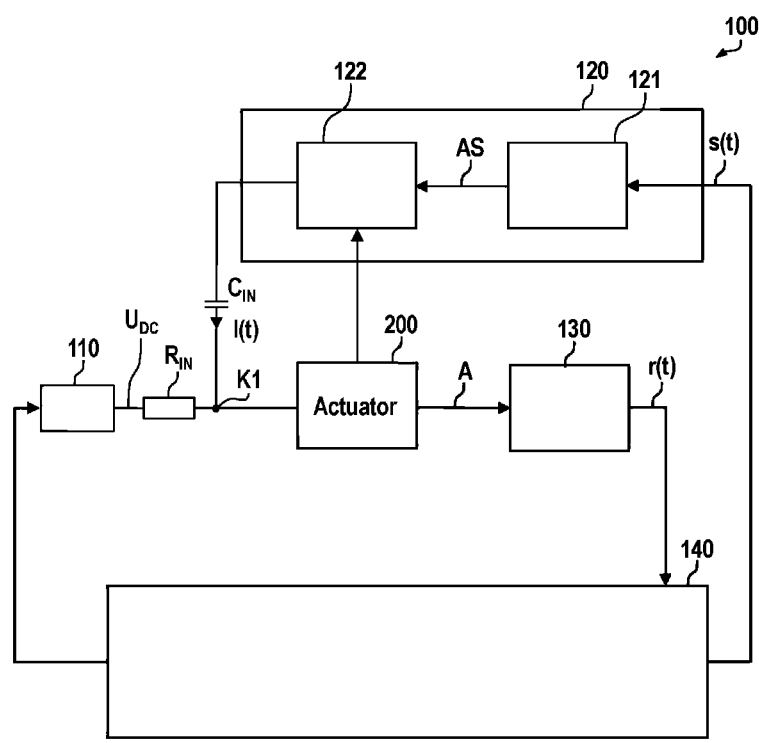
FIG. 1 shows a schematic block diagram of an embodiment of a drive device for driving a capacitive actuator of an optical system.
Figure 10:
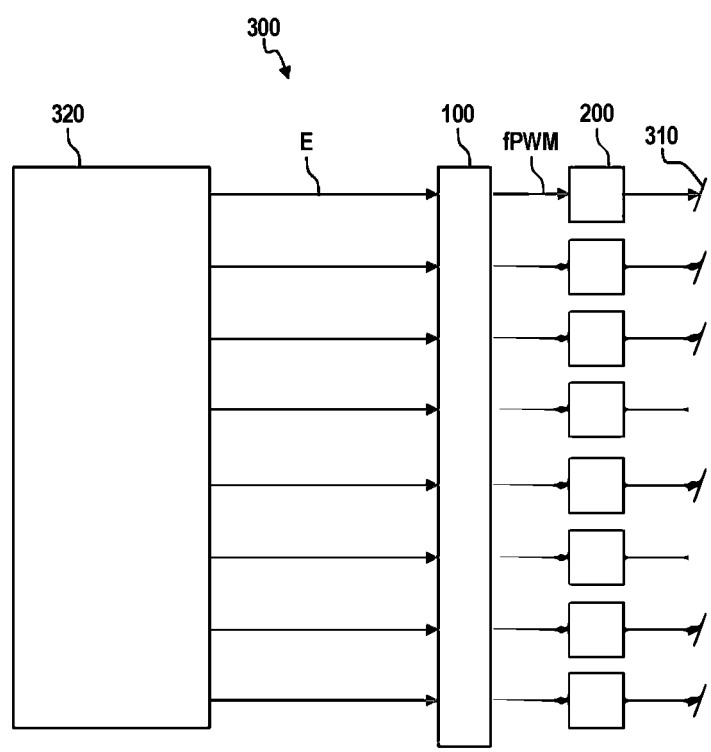
FIG. 10 shows a schematic block diagram of an embodiment of an optical system.
Figure 11A:
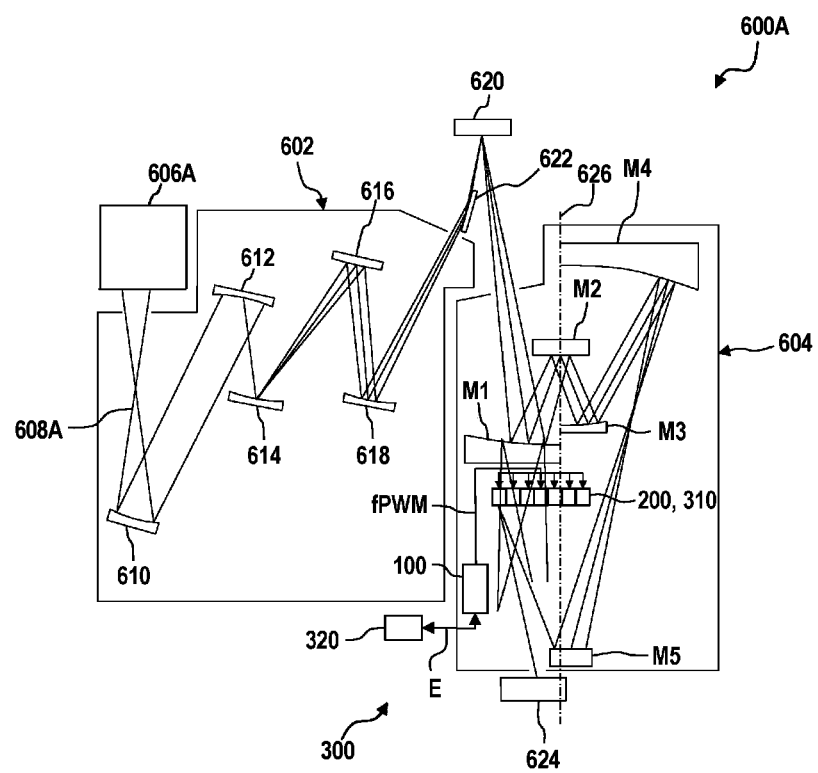
FIG. 11A shows a schematic view of an embodiment of an EUV lithography apparatus and FIG. 11B shows a schematic view of an embodiment of a DUV lithography apparatus.
Figure 11B:
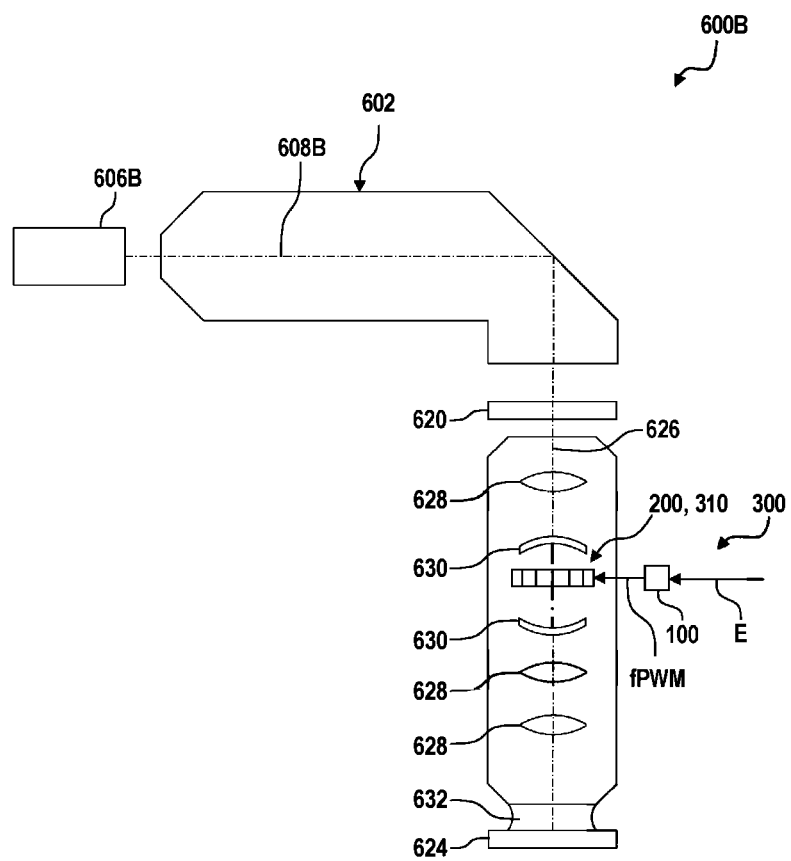

FIG. 1 shows a schematic block diagram of a first embodiment of a drive device 100 for driving a capacitive actuator 200 of an optical system 300. Examples of an optical system 300 are shown in FIGS. 10, 11A and 11B.

The actuator 200 can be, for example, a PMN actuator (PMN; lead magnesium niobate) or a PZT actuator (PZT; lead zirconate titanate). The actuator 200 is suitable for actuating an optical element 310, such as, for example, a lens element, a mirror or an adaptive mirror.

The first embodiment of the drive device 100 in accordance with FIG. 1 is also explained below with reference to FIGS. 2 and 3 and the further figures. In this case, FIG. 2 shows an equivalent circuit diagram of the actuator 200 according to FIG. 1, for example in the region of a resonance point, and FIG. 3 shows a diagram for illustrating the mechanical resonances of the actuator 200 according to FIG. 1.

The drive device 100 in FIG. 1 comprises a drive unit 110 for applying a drive voltage $U_{DC}$ to the actuator 200 for setting a specific position of the driven actuator 200. The drive unit 110 and the actuator 200 are coupled via a first node K1. In the example in FIG. 1, the drive unit 110 is a DC voltage source and the drive voltage $U_{DC}$ is a DC voltage. In this case, an input resistance $R_{IN}$ is connected between the DC voltage source 110 and the first node K1.

Figure 2:
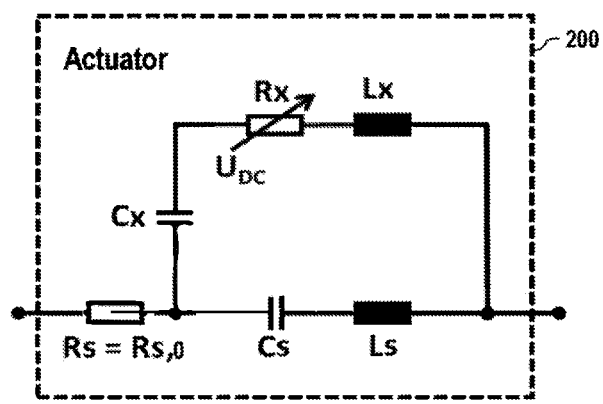
FIG. 2 shows an equivalent circuit diagram to a first approximation of an actuator according to FIG. 1.
Figure 3:
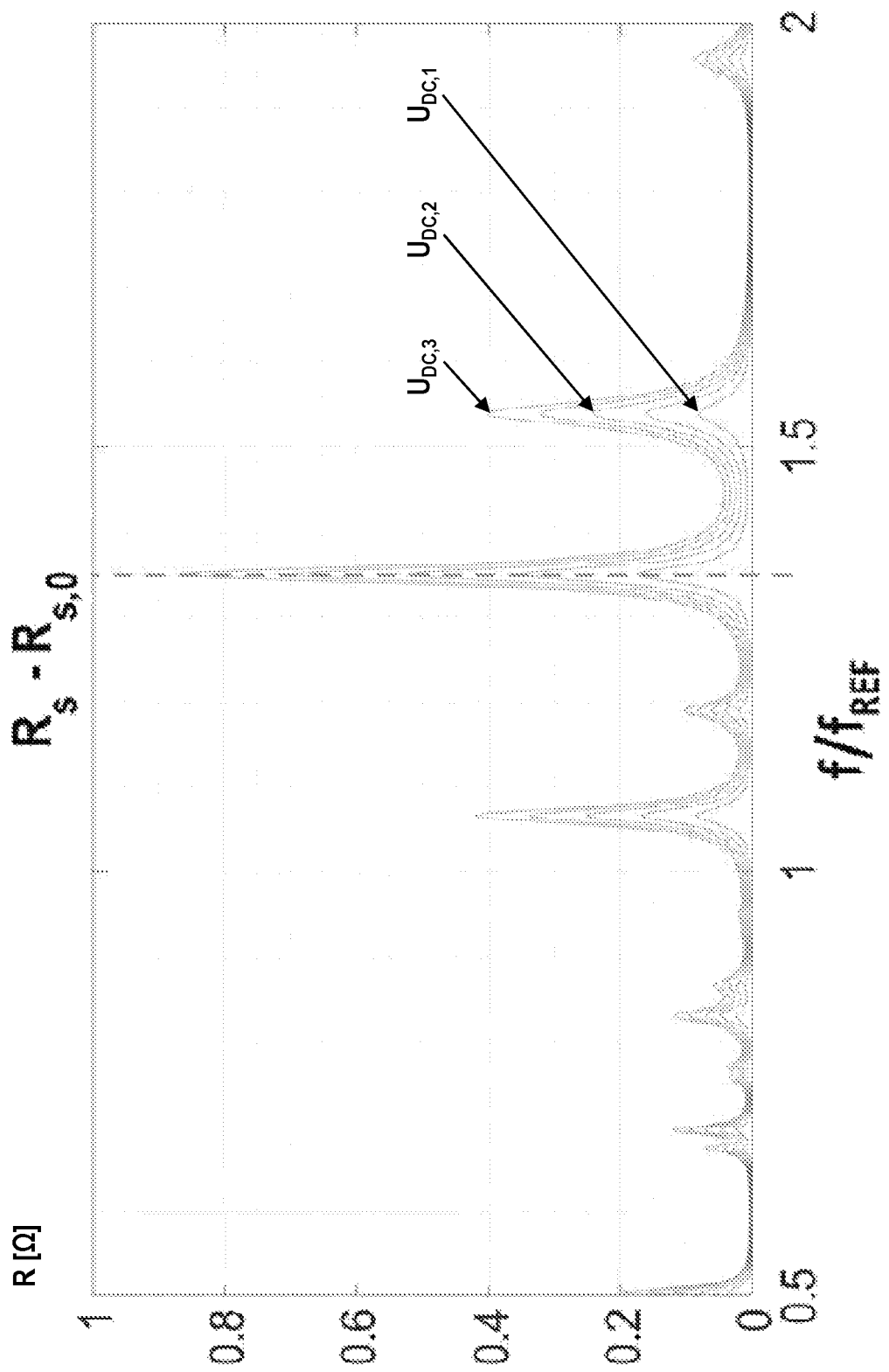
FIG. 3 shows a diagram for illustrating the control-voltage-dependent, electromechanical resonances of an actuator according to FIG. 1.

In accordance with the equivalent circuit diagram in FIG. 2, the actuator 200 can be regarded as a DC-voltage-independent RLC series circuit comprising Rs, Cs and Ls, wherein a further RLC series circuit comprising $R_x$, $C_x$ and $L_x$ is connected in parallel with the reactive components $C_S$ and $L_S$. In accordance with the equivalent circuit diagram in FIG. 2, $L_S$ and $L_x$ shall be lossless, ideal inductances in the simplified actuator equivalent circuit diagram in FIG. 2.

The text hereinafter demonstrates that the dynamic range of the impedance measurement and the measurement speed can be increased via the measurement architecture in FIG. 1 (and in FIG. 4) and a correspondingly chosen excitation signal s(t) (see FIG. 8A, for example).

The influence of the drive voltage $U_{DC}$ on the resonance points (see FIG. 3) will firstly be considered in a decoupled way, proceeding from the impedance behaviour IV to be measured (see FIG. 9) of the actuator 200. As a result of introducing the purely resistive influence—to be considered firstly in a virtual fashion—of the series resistance $R_s$ in accordance with FIG. 2 and the associated resonance manifestation, via the likewise virtual voltage-dependent series damping resistance $R_x$ it is possible to design the measurement architecture in accordance with FIG. 1, which can be used to carry out suitable impedance measurements of the actuator 200, for example in accordance with FIG. 9.

The drive device 100 in FIG. 1 furthermore has a source 120 controlled by an excitation signal s(t) and coupled to the first node K1, for feeding a time-dependent AC current signal I(t) into the first node K1 in such a way that a specific AC voltage arises at the actuator 200 as a result of the superposition of the drive voltage $U_{DC}$ and an AC voltage corresponding to a product of the AC current signal I(t) and the impedance Z of the actuator 200.

The source 120 in FIG. 1 comprises a signal generator 121 controlled by the excitation signal s(t), and a current or voltage source 122 controlled by the output signal AS of the controlled signal generator 121 for outputting the time-dependent AC current signal I(t). A coupling capacitance $C_{IN}$ for coupling to the first node K1 is connected between the current or voltage source 122 and the first node K1.

The drive device 100 in FIG. 1 further has a filter unit 130 connected to the output of the actuator 200 and serving for filtering the output signal A of the actuator 200.

A determining unit 140 is coupled to the output of the filter unit 130 and is configured to determine an impedance behaviour IV of the actuator 200 depending on the filtered output signal r(t) and to output at its output the excitation signal s(t) for driving the source 120.

Figure 6:
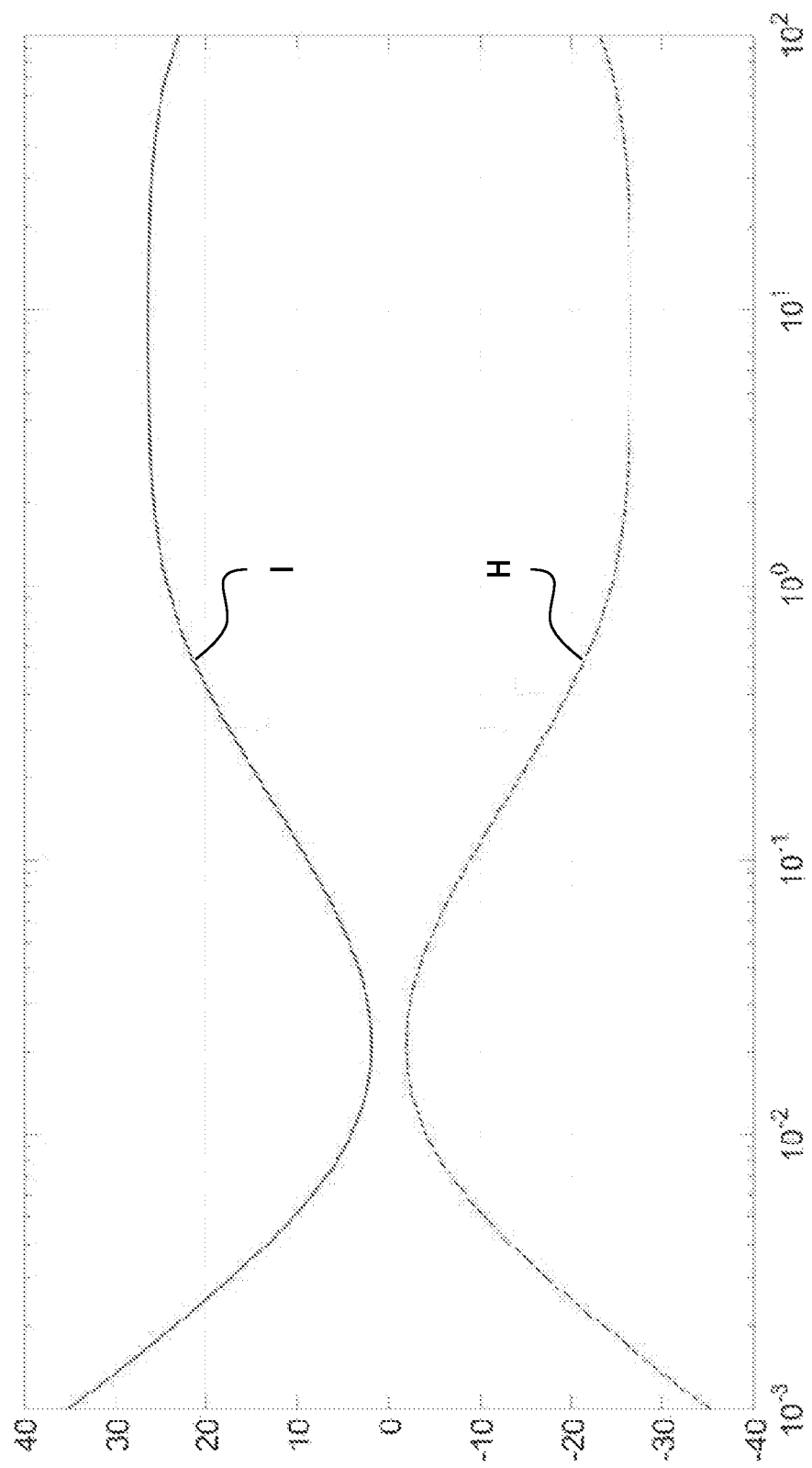
FIG. 6 shows a diagram for illustrating a determined transfer function and the inverse thereof for generating the excitation signal according to FIG. 4.

For example, the determining unit 140 is configured to determine the transfer function H (see FIG. 6) of a section between the output of the signal generator 121 and the output of the filter unit 130, wherein the section comprises the controlled current or voltage source 122, the coupling capacitance $C_{IN}$, the first node K1, the actuator 200 and the filter unit 130. Furthermore, the determining unit 140 is configured to determine an inverse I of the determined transfer function H (see FIG. 6). In this case, the determining unit 140 can be configured to generate the excitation signal s(t) using the calculated inverse I.

Figure 4:
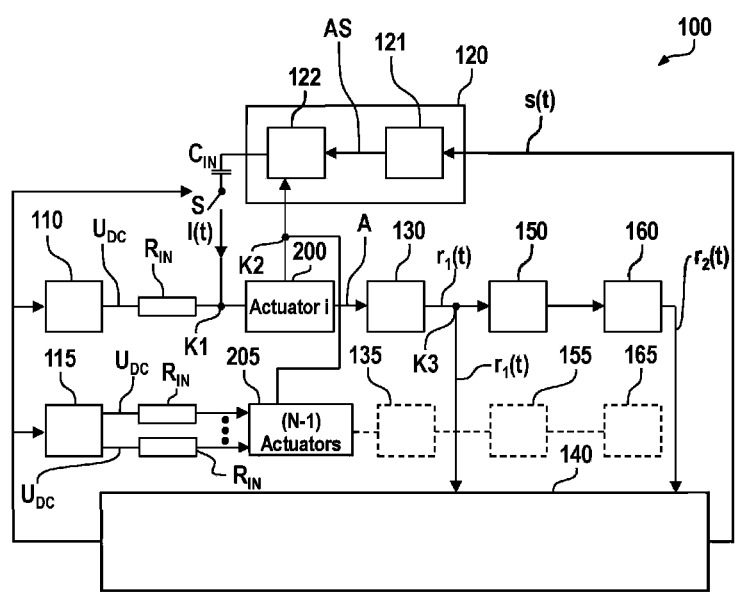
FIG. 4 shows a schematic block diagram of an embodiment of a drive device for driving capacitive actuators of an optical system.

FIG. 4 shows a schematic block diagram of a second embodiment of a drive device 100 for driving capacitive actuators 200, 205 of an optical system 300.

The drive device 100 in FIG. 4 is suitable for driving a plurality N of capacitive actuators 200, 205 of the optical system 300, wherein an optical element 310 of the optical system is assigned to each actuator 200, 205 of the plurality N.

In FIG. 4, the reference sign 200 denotes the actuator i that is currently to be measured, wherein the reference sign 205 denotes the further (N-1) actuators that are currently not being measured with regard to their impedance behaviour. The actuator 200 that is respectively to be measured is selected via the switch S. A drive unit 110, a filter unit 130, a peak-to-peak detector 150 and an output stage 160 are provided for the actuator 200 to be measured.

Analogously to the reference sign 205 denoting the group of (N-1) actuators, the reference sign 115 denotes a group of drive units for the group 205 of (N-1) actuators. Correspondingly, the reference sign 135 denotes a group of filter units for the (N-1) actuators, the reference sign 155 denotes a group of peak-to-peak detectors for the (N-1) actuators 205, and the reference sign 165 denotes a group of output stages for the group of (N-1) actuators.

Therefore, the respective actuator 200, 205 is assigned a respective drive unit 110, 115 for applying a drive voltage $U_{DC}$ to the actuator 200, 205 for setting a specific position of the driven actuator 200, 205 and a respective filter unit 130, 135 connected to the output of the actuator 200, 205 and serving for filtering the output signal of the actuator 200, 205.

The determining unit 140 in FIG. 4 is coupled to the output of the respective filter unit 130, 135.

As already explained above, the impedance behaviour IV of the actuator i having the reference sign 200 is currently being measured in the case of the switch position of the switch S in FIG. 4.

In the example in FIG. 4, the filter unit 130 is embodied as a high-pass filter for providing a high-pass-filtered output signal $r_1(t)$. A peak-to-peak detector 150 and an output stage 160 connected downstream of the peak-to-peak detector 150 for providing at least one narrowband partial output signal $r_2(t)$ are connected downstream of the high-pass filter 130. In this case, the determining unit 140 is configured to carry out a broadband determination of the impedance behaviour IV of the actuator 200 on the basis of the high-pass-filtered output signal $r_1(t)$ and/or to carry out a narrowband determination of the impedance behaviour IV of the actuator 200 on the basis of the at least one narrowband partial output signal $r_2(t)$. In this case, the determining unit 140 samples the outputs of the high-pass filter 130 in order to obtain the signal $r_1(t)$ and the output of the output stage 160 in order to obtain the signal $r_2(t)$. Furthermore, the determining unit 140 controls the switches S, wherein the switches S assigned to the N-1 actuators 205 are not depicted in FIG. 4 for illustration reasons, and calculates the respective excitation signal s(t) for the source 120.

The determining unit 140 is embodied as an SPU (Signal Processing Unit), for example. To summarize, the determining unit 140 controls the switches S and the drive voltages $U_{DC}$, calculates the excitation signals s(t) for the source 120 and samples the outputs of the high-pass filter 130 and of the output stage 160.

Overall, in the case of the drive device 100 in FIG. 4 for fast inline measurement of the impedance behaviour IV of the individual actuator 200, 205 the following measures are implemented:

1. Dedicated inline impedance measurement with applied DC+AC voltage comprising drive voltage $U_{DC}$ and the AC voltage I(t)*Z. Application measurement frequencies of the order of magnitude of Hz to 100 kHz are covered here.

2. A broadband, low-noise controllable current or voltage source 122 is used as part of the source 120.

3. The measurement signal (amplitude response and phase response) of the current or voltage profile arising at the actuator impedance is coupled out at the outputs 130 and 4. The measurement of the voltage dropped across the actuator 200 can be carried out either in a narrowband fashion by way of the signal $r_2(t)$ (also referred to as scanning mode, e.g. via the sinusoidal excitation signal) or else in a broadband fashion via the signal $r_1(t)$ (also referred to as IFT mode, e.g. via inverse Fourier transformation).

Referring to the equivalent circuit diagram in FIG. 2, the decoupling of the impedance alteration of the purely resistive influence—to be considered firstly in a virtual fashion—of the series resistance $R_s$ (=$R_{S,0}$ in the zero voltage state) and the associated resonance manifestation is achieved via the likewise virtual control-voltage-dependent series damping resistance $R_x$ in that the actuator 200, as already explained above, is regarded as a DC-voltage-independent RLC series circuit ($R_s$, $C_s$ and $L_s$) (cf. FIG. 2) and the further RLC series circuit comprising $R_x$, $C_x$ and $L_x$ is connected in parallel with the reactive components $C_s$ and $L_s$.

Figure 5:
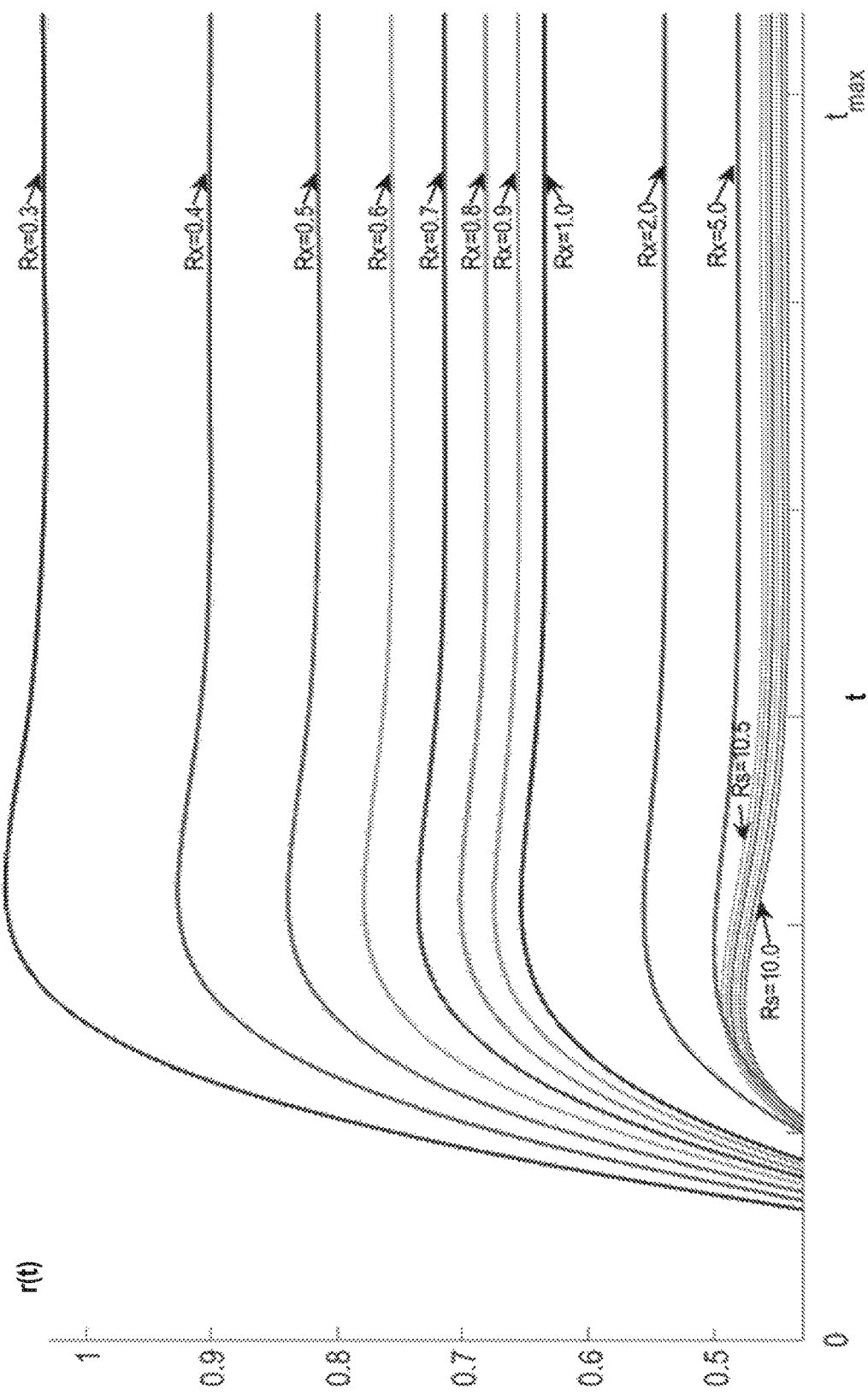
FIG. 5 shows a diagram for illustrating a measurement voltage profile of the filtered output signal of an actuator according to FIG. 4.

Variation of $R_x$ thus simulates the DC voltage influence to a first approximation; if the resistance $R_x$ decreases (with higher $U_{DC}$), the resonance is amplified; by contrast, if the resistance $R_x$ increases (with lower $U_{DC}$), a lower manifestation of the resonance results. In this respect, FIG. 5 shows a diagram for illustrating a measurement voltage profile of the filtered output signal $r_2(t)$ of the actuator 200 according to FIG. 2.

The following can equivalently be formulated: An increase in the drive voltage $U_{DC}$ of the actuator 200 which results in a slight variation of the real $R_s$ accordingly causes a slight decrease in $R_x$ which in turn results in a strong manifestation of the resonances in the actuator 200. In this respect, FIG. 5 shows a peak value of the measurement voltage profile in the scanning mode: Amplitude measurement value in the settled state for actuator impedances without resonance (variation of the series resistance $R_s$) in the case of a resonance (variation of the series damping resistance $R_x$) measured at a chosen measurement frequency.

For a suitable design of the coupling capacitance $C_{IN}$ and of the input resistances $R_{IN}$, the following may hold true: $C_{IN} \gg C_s$ and $R_{IN} \gg R_s$ One example in this respect: $C_{IN} \geq 10*C_s$ and $R_{IN} \geq N*R_s$ for a number of N actuators, as shown in FIG. 4, in order to ensure a sufficient coupling of the excitation signal (sinusoidal or calculated by IFT).

A fast broadband image of the actuator resonances can be obtained via fast Fourier calculation (FFT; Fast Fourier Transformation) of the output signal $r_1(t)$. The maximum measurement frequency can be of the order of magnitude of MHz, such as approximately 100 kHz or less. In this case, the excitation signal s(t) is a sinusoidal signal or optionally an excitation signal calculated via inverse Fourier transformation. The IFT stimulus can be calculated from a predefined excitation frequency profile. In this case, via a suitably chosen profile, the sensitivity of the impedance measurement can be increased, for example by way of a frequency response chosen deliberately to be flat in the vicinity of a resonant frequency (cf. FIG. 3). A flat profile of the output $r_2(t)$ can be achieved e.g. by the excitation signal s(t) having an inverse excitation frequency profile with respect to the actuator impedance.

As explained above, the determining unit 140 in FIG. 4 is able to determine the impedance behaviour IV of the actuator 200 inline and rapidly, for example in real time. On the basis thereof, it is possible to implement active damping measures against the electromechanical disturbances (see FIG. 3) in the actuator resonances that arise as a result of the drive voltage $U_{DC}$.

Figure 9A:
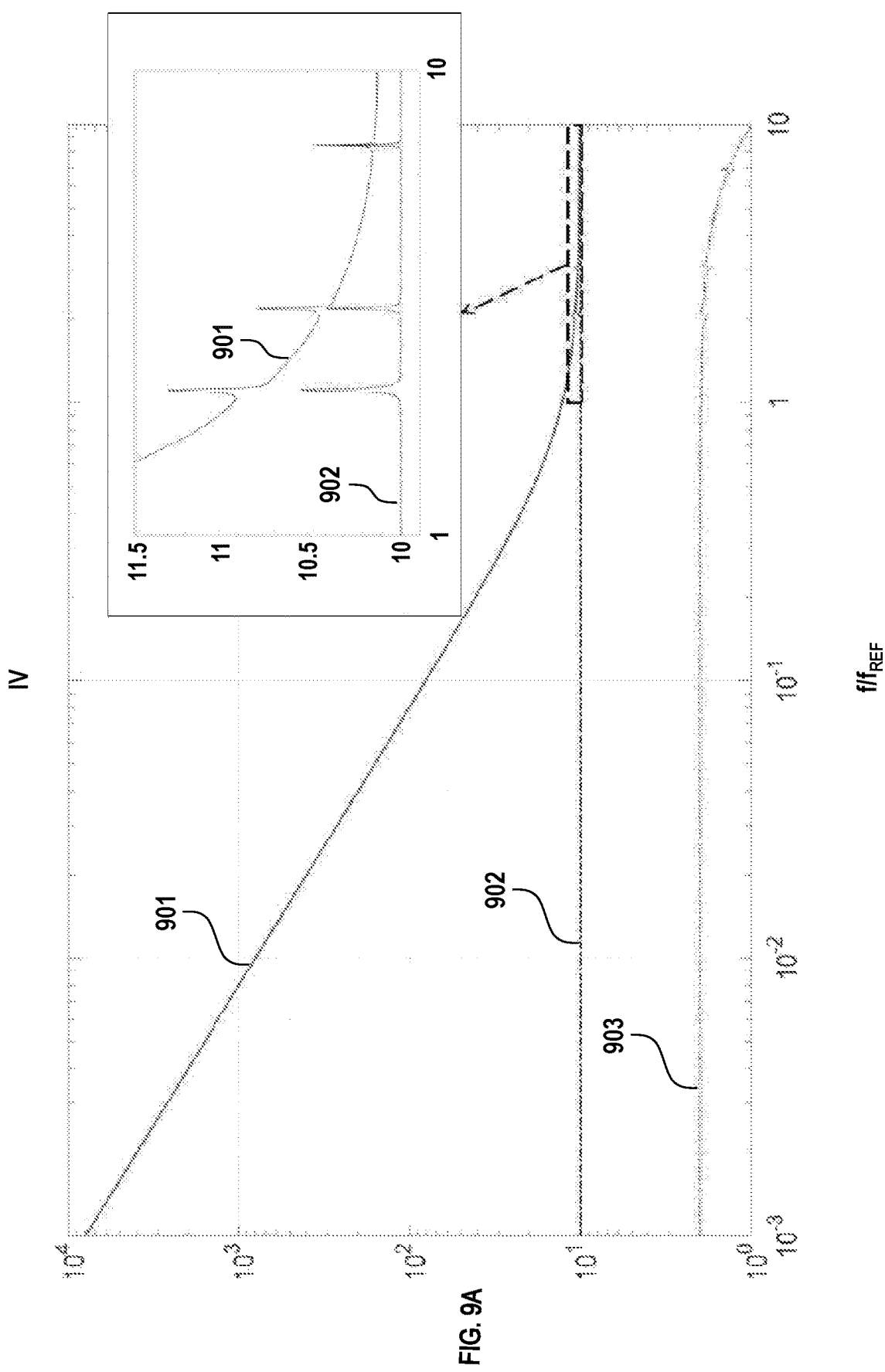
FIG. 9A shows a diagram for illustrating the theoretical impedance behaviour to be measured of an actuator according to FIG. 4 for a predefined drive voltage.

In this case, the determining unit 140 is configured for example to generate the excitation signal s(t) depending on the determined impedance behaviour IV of the actuator 200 in such a way that the AC voltage arising at the actuator 200 has an amplitude that is constant over the frequency. In this respect, FIG. 9A shows a diagram for illustrating the theoretical impedance behaviour to be measured of the actuator 200 according to FIG. 4 for a predefined drive voltage $U_{DC}$. In detail, in FIG. 9A, the curve 901 shows the impedance of the actuator 200, the curve 902 shows the real resistance of the actuator and the curve 903 shows the capacitance (relative to a reference capacitance).

Thus, in order to carry out a faster measurement of all actuator resonances in the frequency range of interest, the impedance measurement architecture in accordance with FIG. 4 can be used. In this case, for example, a broadband excitation signal s(t) for each actuator of interest, here for example the actuator 200, is calculated via inverse Fourier transformation proceeding from an excitation frequency profile and is transferred to a sufficiently fast digital-to-analogue converter, accommodated in the signal generator 121, for example.

Via a fast Fourier transformation of the output signal $r_1(t)$, for each actuator with an applied drive voltage $U_{DC}$ in the frequency range of interest all resonance points are determined in real time:

An initial transfer function H of the section between the output of the signal generator 121 and the output of the high-pass filter 130 is determined, for example with a drive voltage $U_{DC}$ of 0 V or for $R_s = R_{s,0}$.

The inverse transfer function or inverse I (see FIG. 6) of the initial transfer function H is then calculated.

Figure 7:
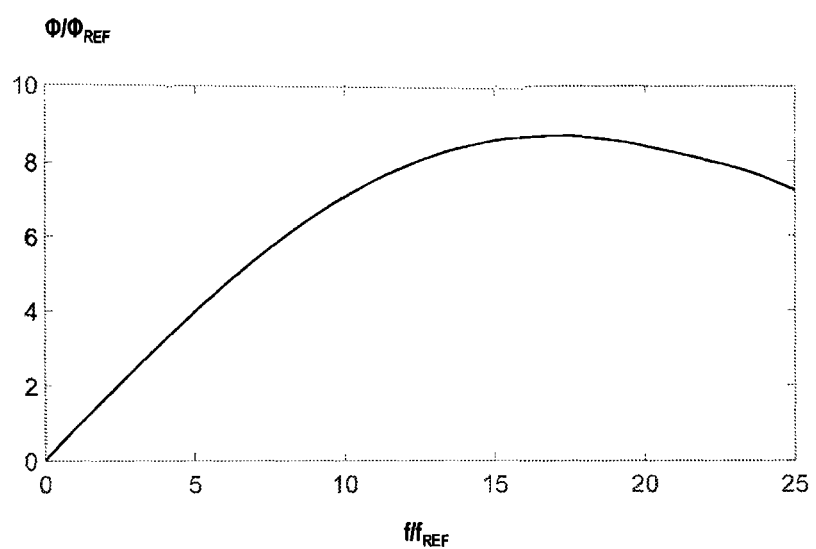
FIG. 7 shows a diagram for illustrating an exemplary embodiment of a suitable phase profile for generating the excitation signal according to FIG. 4.

The excitation signal s(t) can then be calculated from the inverse Fourier transformation of the inverse transfer function I and a suitable phase profile $\Phi(f)$. In this respect, FIG. 7 shows an exemplary embodiment of a suitable phase profile $\Phi(f)$ for calculating the IFT excitation signal s(t).

Figure 8A:
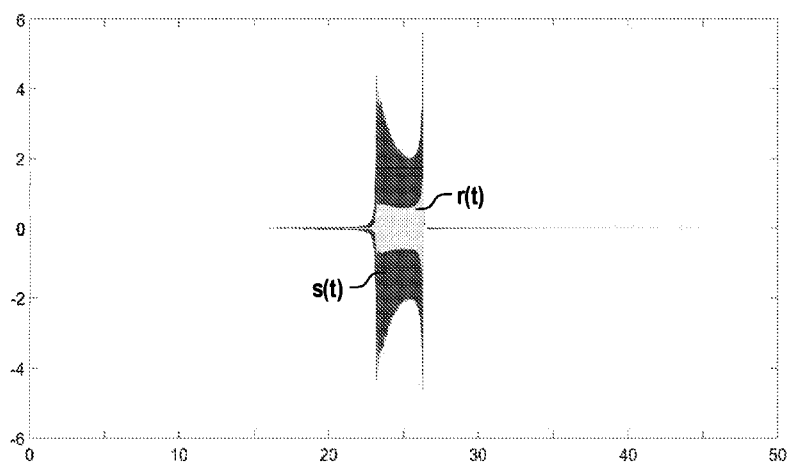
FIG. 8A shows a diagram for illustrating an exemplary embodiment of a suitable excitation signal and the AC component of the resulting response signal.

In this respect, FIG. 8A shows a diagram for illustrating an exemplary embodiment of a suitable excitation signal s(t) and the AC component $I(t)*Z(j\Omega)$ of the resulting response signal r(t).

Figure 8B:
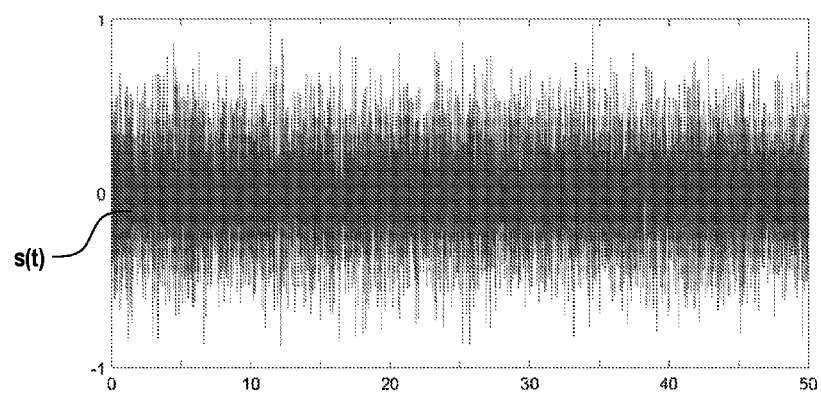
FIG. 8B shows a diagram for illustrating a further exemplary embodiment of a suitable excitation signal.

Moreover, FIG. 8B illustrates a diagram for illustrating a further exemplary embodiment of a suitable excitation signal s(t). FIG. 8B shows a different excitation signal s(t) by comparison with FIG. 8A. The excitation signal s(t) in FIG. 8B is based on a different phase function compared with the excitation signal s(t) in FIG. 8A. Comparison of FIGS. 8A and 8B shows that the energy in FIG. 8B is more distributed over time than in FIG. 8A. The excitation signal s(t) in FIG. 8B can also be regarded as a pseudo-noise signal and can also be used permanently during operation of the lithography apparatus.

Alternatively, it is also possible to use, instead of the inverse transfer function I with respect to the transfer function H, some other transformation of H that can cause the resonance points of the actuator 200. In this case, the phase profile $\Phi(f)$ can have any desired profile. It is also possible to use different frequency ranges for groups or subgroups of actuators 200, 205, both for excitation and for detection. Frequency-division multiplexing operation can be used for this purpose.

Figure 9B:
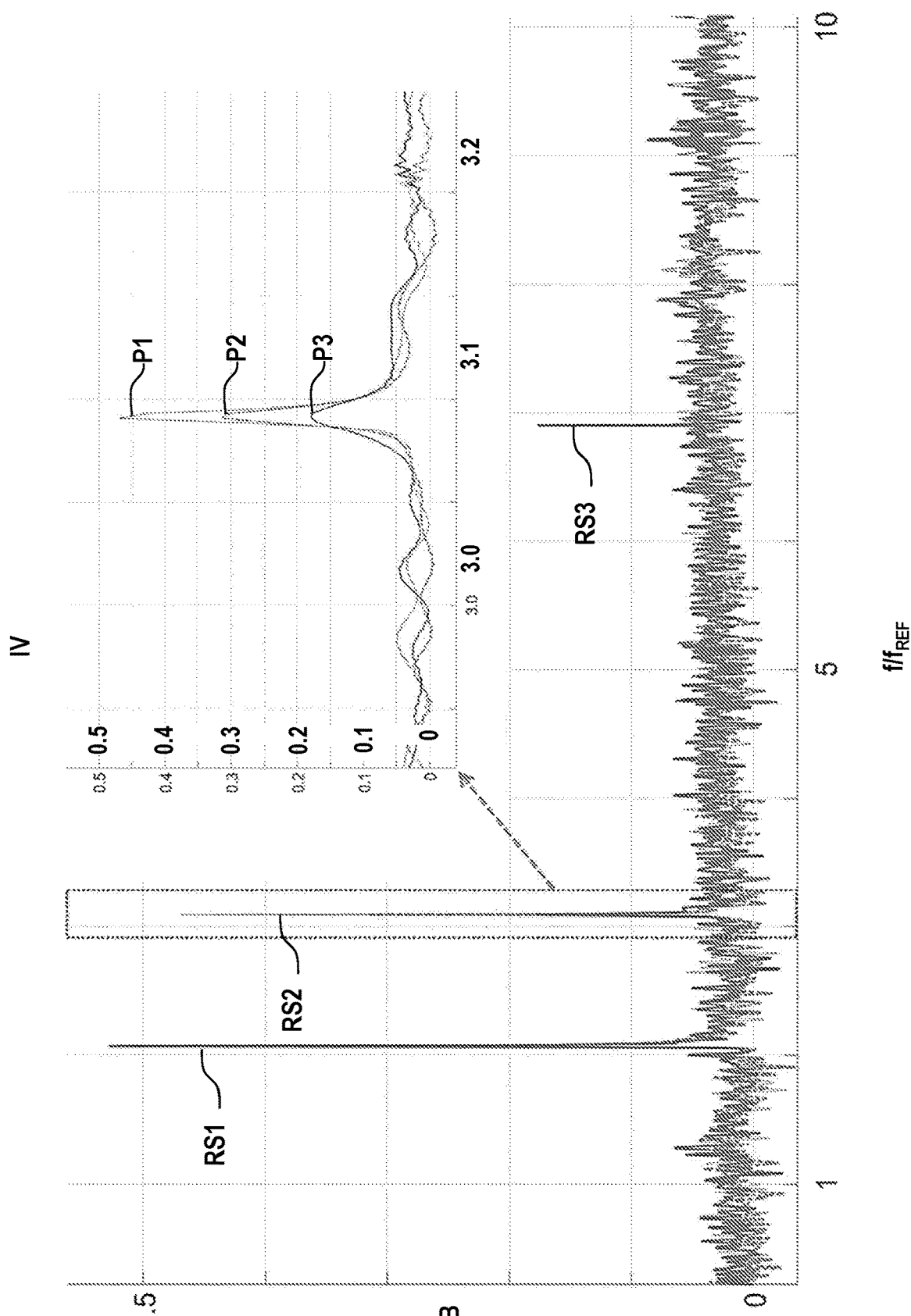
FIG. 9B shows a first diagram for illustrating an experimentally measured impedance behaviour of an actuator according to FIG. 4 for predefined drive voltages.
Figure 9C:
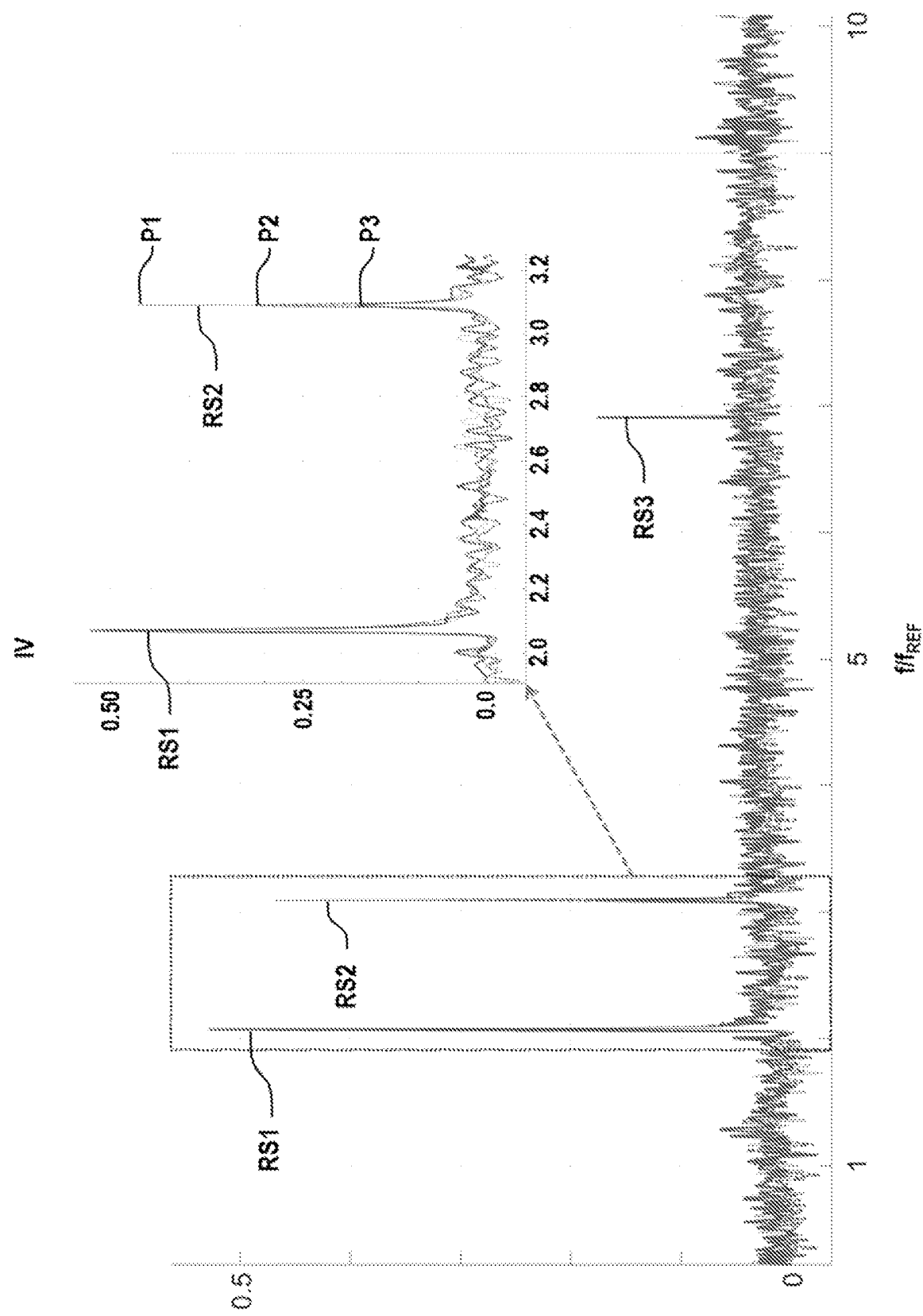
FIG. 9C shows a second diagram for illustrating the experimentally measured impedance behaviour of the actuator according to FIG. 4 for predefined drive voltages.

In this respect, FIG. 9B and FIG. 9C show diagrams for illustrating the experimentally measured impedance behaviour of the actuator 200 according to FIG. 4. As shown in FIG. 9A, the falling curve 901 represents a theoretical actuator impedance to be measured wherein the fall extends over three orders of magnitude (from 10 kΩ down to 10Ω in this exemplary embodiment). As can be gathered from the box showing an enlarged view in FIG. 9A, three very small resonance points of the actuator 200 can be seen for a drive voltage.

In this context, the impedance behaviour of an actuator 200 according to FIG. 4 was measured in an experiment for predefined drive voltages.

The measured impedance behaviour of the actuator 200 exhibits three resonance points RS1, RS2 and RS3 in FIG. 9B and in FIG. 9C. The first resonance point RS1 and the third resonance point RS3 arise for one and the same drive voltage, which can also be referred to as actuator DC voltage and is 75 volts, for example. The second resonance point RS2 at $f/f_{REF}=3.1$ arises for three different drive voltages or actuator DC voltages of, for example, 50 volts, 75 volts and 100 volts. The box showing an enlarged view in FIG. 9B shows that three different peaks P1 (for a drive voltage of 100 volts), P2 (for a drive voltage of 75 volts) and P3 (for a drive voltage of 50 volts) are able to be differentiated at the resonance point RS2. The same is shown by the box showing the enlarged view in FIG. 9C and this emphasizes that at the first resonance point RS1 one peak is caused by a single actuator DC voltage and at the second resonance point RS2 three peaks P1, P2 and P3 are caused by three actuator DC voltages.

Overall, the experiment in accordance with FIG. 9B and in accordance with FIG. 9C shows how the impedance measurement values for an IFT excitation with a length of just under 50 milliseconds, for example, can be correctly mapped.

An example of a computation algorithm for the excitation signal s(t) is presented below:

$U_{Stim}(t):=s(t)$ shall be the output voltage of the high-pass filter 130—also the input voltage for the source 120;

$U_{out}(j\omega)$ shall be the complex excitation response voltage at the output of the high-pass filter 130;

$H_o(j\omega)$ shall be the frequency-dependent signal transfer function of $U_{Stim}(j\omega)$ with respect to the output signal of the high-pass filter 130;

$Z_{Act}$ shall be the actuator impedance;

$Z_o$ shall be a fixed, selected reference resistance (e.g. 10Ω or 50Ω);

α shall be a constant transfer factor and $U_{Stim,o}$ shall be a voltage amplitude set by the SPU 140.

$s(t):=U_{Stim}(t)$ shall be the excitation signal. The following equations hold true in this exemplary embodiment:

$$U_{Out}(j\omega) = \alpha \frac{Z_{Act}(j\omega)}{Z_o} \cdot U_{Stim}(j\omega), \quad (1)$$

and where $$U_{Stim}(j\omega) = U_{Stim,o} \cdot H_{o1}(j\omega) \quad (2)$$

there follows:

$$U_{Out}(j\omega) = \alpha \frac{Z_o \cdot H_o(j\omega)}{Z_o} \cdot (U_{Stim,o} \cdot H_{o1}(j\omega)); \quad (3)$$

and where $$H_{o1}(j\omega) \approx H_o^{-1}(j\omega)|_{U_{DC}=0V}; \quad (4)$$

This results in an, as shown in FIG. 9A, almost flat profile of the frequency response apart from the resonance points of the actuator 200 that are to be emphasized.

FIG. 10 shows a schematic block diagram of an embodiment of an optical system 300 comprising a plurality of actuatable optical elements 310. The optical system 300 is embodied here as a micromirror array, wherein the optical elements 310 are micromirrors. Each micromirror 310 is actuatable via an assigned actuator 200. By way of example, a respective micromirror 310 can be tilted about two axes and/or displaced in one, two, or three spatial axes via the assigned actuator 200. The reference signs only of the topmost row of these elements are depicted, for reasons of clarity.

The optical system 300 comprises a correction unit 320 configured for generating an input signal E for each of the micromirrors 310. By way of example, the optical system 300 is configured for correcting a wavefront of light in a lithography apparatus 600A, 600B (see FIGS. 6A, 6B), wherein the correction unit 320, for example, depending on a measured shape of the wavefront and a target shape of the wavefront, determines a target position of each of the micromirrors 310 and outputs a corresponding input signal E.

The respective input signal E is fed to a drive device 100 assigned to a respective actuator 200. The drive device 100 drives the respective actuator 200 for example with a filtered, amplified modulation signal fPWM. The drive device 100 has been described with reference to FIGS. 1 to 9, for example. A position of the respective micromirror 310 is thus set.

FIG. 11A shows a schematic view of an EUV lithography apparatus 600A comprising a beam-shaping and illumination system 602 and a projection system 604. In this case, EUV stands for "extreme ultraviolet" and denotes a wavelength of the working light of between 0.1 nm and 30 nm. The beam-shaping and illumination system 602 and the projection system 604 are respectively provided in a vacuum housing (not shown), wherein each vacuum housing is evacuated with the aid of an evacuation device (not shown). The vacuum housings are surrounded by a machine room (not shown), in which drive devices for mechanically moving or setting optical elements are provided. Moreover, electrical controllers and the like can also be provided in this machine room.

The EUV lithography apparatus 600A comprises an EUV light source 606A. A plasma source (or a synchrotron), which emits radiation 608A in the EUV range (extreme ultraviolet range), that is to say for example in the wavelength range of 5 nm to 20 nm, can for example be provided as the EUV light source 606A. In the beam-shaping and illumination system 602, the EUV radiation 608A is focused and the desired operating wavelength is filtered out from the EUV radiation 608A. The EUV radiation 608A generated by the EUV light source 606A has a relatively low transmissivity through air, for which reason the beam-guiding spaces in the beam-shaping and illumination system 602 and in the projection system 604 are evacuated.

The beam-shaping and illumination system 602 illustrated in FIG. 11A has five mirrors 610, 612, 614, 616, 618. After passing through the beam-shaping and illumination system 602, the EUV radiation 608A is guided onto a photomask (reticle) 620. The photomask 620 is likewise embodied as a reflective optical element and can be arranged outside the systems 602, 604. Furthermore, the EUV radiation 608A can be directed onto the photomask 620 via a mirror 622. The photomask 620 has a structure which is imaged onto a wafer 624 or the like in a reduced fashion via the projection system 604.

The projection system 604 (also referred to as a projection lens) has five mirrors M1 to M5 for imaging the photomask 620 onto the wafer 624. In this case, individual mirrors M1 to M5 of the projection system 604 can be arranged symmetrically in relation to an optical axis 626 of the projection system 604. It should be noted that the number of mirrors M1 to M6 of the EUV lithography apparatus 600A is not restricted to the number represented. A greater or lesser number of mirrors M1 to M5 can also be provided. Furthermore, the mirrors M1 to M5 are generally curved at their front side for beam shaping.

Furthermore, the projection system 604 comprises an optical system 300 having a plurality of actuatable optical elements 310, for example the micromirror array described with reference to FIG. 10. The optical system 300 is configured for example for correcting dynamic imaging aberrations. The projection system 604 comprising the optical system 300 can be referred to as an adaptive optical unit. A resolution of the lithography apparatus 600A can thereby be increased. By way of example, depending on measured values of the wavefront of the projection light, a correction unit 320 generates an input signal E, which can comprise an individual signal for example for a respective micromirror 310. The input signal E is converted into an amplified, filtered modulation signal fPWM by the drive device 100 for a respective optical element 310, and output to the respective actuator 200 for actuating the optical element 310. The respective actuator 200 correspondingly actuates the assigned micromirror 310.

FIG. 11B shows a schematic view of a DUV lithography apparatus 600B, which comprises a beam-shaping and illumination system 602 and a projection system 604. In this case, DUV stands for "deep ultraviolet" and denotes a wavelength of the working light of between 30 nm and 250 nm. As has already been described with reference to FIG. 11A, the beam-shaping and illumination system 602 and the projection system 604 can be arranged in a vacuum housing and/or be surrounded by a machine room with corresponding drive devices.

The DUV lithography apparatus 600B has a DUV light source 606B. By way of example, an ArF excimer laser that emits radiation 608B in the DUV range at 193 nm, for example, can be provided as the DUV light source 606B.

The beam-shaping and illumination system 602 illustrated in FIG. 11B guides the DUV radiation 608B onto a photomask 620. The photomask 620 is embodied as a transmissive optical element and can be arranged outside the systems 602, 604. The photomask 620 has a structure which is imaged onto a wafer 624 or the like in a reduced fashion via the projection system 604.

The projection system 604 has a plurality of lens elements 628 and/or mirrors 630 for imaging the photomask 620 onto the wafer 624. In this case, individual lens elements 628 and/or mirrors 630 of the projection system 604 can be arranged symmetrically in relation to an optical axis 626 of the projection system 604. It should be noted that the number of lens elements 628 and mirrors 630 of the DUV lithography apparatus 600B is not restricted to the number represented. A greater or lesser number of lens elements 628 and/or mirrors 630 can also be provided. Furthermore, the mirrors 630 are generally curved at their front side for beam shaping.

Furthermore, the projection system 604 comprises an optical system 300 having a plurality of actuatable optical elements 310, for example a microlens element array, which can be constructed for example according to the micromirror array described with reference to FIG. 10, wherein microlens elements are used instead of the micromirrors. The optical system 300 is configured for example for correcting dynamic imaging aberrations. The projection system 604 comprising the optical system 300 can be referred to as an adaptive optical unit. A resolution of the lithography apparatus 600B can thereby be increased. In order to improve the imaging performance, in the present case an input signal E is predefined from outside. The input signal E comprises, for example, an individual signal for each of the microlens elements 310 of the optical system 300. The drive device 100 converts the signal contained in the input signal E for a respective microlens element 310 into an amplified, filtered modulation signal fPWM and outputs the latter to the respective actuator 200. The respective actuator 200 correspondingly actuates the assigned microlens element 310.

An air gap between the last lens element 628 and the wafer 624 may be replaced by a liquid medium 632 which has a refractive index of >1. The liquid medium 632 may be for example high-purity water. Such a construction is also referred to as immersion lithography and has an increased photolithographic resolution. The medium 632 can also be referred to as an immersion liquid.

Although the present disclosure has been described on the basis of exemplary embodiments, it is modifiable in diverse ways.

LIST OF REFERENCE SIGNS

100 Drive device
110 Drive unit
115 Group of drive units
120 Source
121 Signal generator
122 Controlled current or voltage source
130 Filter unit
135 Group of filter units
140 Determining unit
150 Peak-to-peak detector
155 Group of peak-to-peak detectors
160 Output stage
165 Group of output stages
200 Actuator
205 Group of N−1 actuators
300 Optical system
310 Optical element
320 Correction unit
600A EUV lithography apparatus
600B DUV lithography apparatus
602 Beam-shaping and illumination system
604 Projection system
606A EUV light source
606B DUV light source
608A EUV radiation
608B DUV radiation
610 Mirror
612 Mirror
614 Mirror
616 Mirror
618 Mirror
620 Photomask
622 Mirror
624 Wafer
626 Optical axis
628 Lens element
630 Mirror
632 Medium
901 Curve
902 Curve
903 Curve
A Output signal
aPWM Amplified signal
AS Output signal of the controlled signal generator
$C_{IN}$ Coupling capacitance
$C_s$ Capacitance
$C_x$ Capacitance
E Input signal
f Frequency
fPWM Filtered signal
$f_{REF}$ Reference frequency
H Transfer function
I Inverse of the transfer function
I(t) AC current signal IV Impedance behaviour
K1 First node
K2 Second node
K3 Third node
$L_s$ Inductance
$L_x$ Inductance
M1 Mirror
M2 Mirror
M3 Mirror
M4 Mirror
M5 Mirror
P1 Peak
P2 Peak
P3 Peak
r(t) Filtered output signal
$r_1(t)$ High-pass-filtered output signal
$r_2(t)$ Narrowband output signal
$R_{IN}$ Input resistance
$R_s$ Resistance
$R_{s,0}$ Resistance in the zero voltage state
RS1 Resonance point
RS2 Resonance point
RS3 Resonance point
$R_x$ Resistance
S Switch
s(t) Drive signal
$U_{DC}$ Drive voltage
$U_{DC,1}$ Drive voltage
$U_{DC,2}$ Drive voltage
$U_{DC,3}$ Drive voltage
Z Impedance of the actuator

What is claimed is:

1. A drive device configured to drive a capacitive actuator to actual an optical element of an optical system, the drive device comprising:
   a drive unit coupled to the capacitive actuator via a first node, the drive unit configured to apply a drive voltage to the capacitive actuator to set a position of the capacitive actuator;
   a source controllable by an excitation signal and coupled to the first node to feed a time-dependent AC current signal into the first node so that an AC voltage arises at the capacitive actuator due to a superposition of the drive voltage and an AC voltage corresponding to a product of the AC current signal and an impedance of the capacitive actuator;
   a filter unit connected to an output of the capacitive actuator and configured to filter an output signal of the capacitive actuator; and
   a determining unit coupled to an output of the filter unit and configured to determine an impedance behaviour of the capacitive actuator depending on the filtered output signal, the determining unit configured to output the excitation signal to drive the source.

2. The drive device of claim 1, wherein the source comprises:
   a signal generator controllable by the excitation signal; and
   a current or voltage source controllable by an output signal of the signal generator to output the time-dependent AC current signal.

3. The drive device of claim 2, wherein the determining unit is configured to determine:
   a transfer function of a section between the output of the signal generator and the output of the filter unit, wherein the section comprises the controlled current or voltage source, the first node, the capacitive actuator and the filter unit;
   an inverse of the transfer function; and
   the excitation signal based on the calculated inverse.

4. The drive device of claim 3, wherein the transfer function is a frequency-dependent signal transfer function of the excitation signal embodied as a time-dependent excitation voltage and of the filtered output signal embodied as a complex excitation response voltage.

5. The drive device of claim 1, wherein the filter unit is a high-pass filter to provide a high-pass-filtered output signal.

6. The drive device of claim 5, wherein:
   the drive device further comprises a peak-to-peak detector connected downstream of the high-pass filter and an output stage connected downstream of the peak-to-peak detector to provide at least one narrowband partial output signal;
   the determining unit is configured to perform a broadband determination of the impedance behaviour of the capacitive actuator on the basis of the high-pass-filtered output signal and/or to perform a narrowband determination of the impedance behaviour of the capacitive actuator on the basis of the at least one narrowband partial output signal.

7. The drive device of claim 1, wherein the determining unit is configured to generate the excitation signal depending on the determined impedance behaviour of the capacitive actuator so that the AC voltage arising at the capacitive actuator has an amplitude that is constant over the frequency.

8. The drive device of claim 7, wherein the drive device is configured to control, by open-loop or closed-loop control, the AC voltage arising at the capacitive actuator.

9. The drive device of claim 1, wherein the drive unit comprises a DC voltage source and an input resistance is connected between the DC voltage source and the first node.

10. The drive device of claim 1, wherein the source comprises a controllable voltage or current source and a coupling capacitance is connected between the voltage or current source and the first node.

11. The drive device of claim 1, wherein the drive device is configured to drive a plurality of capacitive actuators of the optical system, and an optical element of the optical system is assigned to a respective capacitive actuator.

12. The drive device of claim 11, wherein:
   for each respective capacitive actuator, the capacitive actuator is assigned at least one respective drive unit to apply a drive voltage to the capacitive actuator to set a position of the capacitive actuator and a respective filter unit connected to the output of the capacitive actuator to filter an output signal of the capacitive actuator; and
   the determining unit is coupled to the output of the respective filter unit and is configured to determine the impedance behaviour of the respective capacitive actuator depending on the respective filtered output signal and to output at its output the excitation signal for the respective capacitive actuator.

13. The drive device of claim 12, wherein:
   the respective first node is connectable to the source via a respective controllable switch; and
   the determining unit is configured, to determine the impedance behaviour of a specific capacitive actuator of the plurality of capacitive actuator, to drive the drive unit assigned to the specific capacitive actuator and the switch assigned to the specific capacitive actuator.

14. The drive device of claim 1, wherein:

the source comprises:

a signal generator controllable by the excitation signal; and a current or voltage source controllable by an output signal of the signal generator to output the time-dependent AC current signal; and the filter unit is a high-pass filter to provide a high-pass-filtered output signal.

15. The drive device of claim 1, wherein:

the source comprises:

a signal generator controllable by the excitation signal; and a current or voltage source controllable by an output signal of the signal generator to output the time-dependent AC current signal; and the determining unit is configured to generate the excitation signal depending on the determined impedance behaviour of the capacitive actuator so that the AC voltage arising at the capacitive actuator has an amplitude that is constant over the frequency.

16. The drive device of claim 1, wherein:

the source comprises:

a signal generator controllable by the excitation signal; and a current or voltage source controllable by an output signal of the signal generator to output the time-dependent AC current signal; and the drive unit comprises a DC voltage source and an input resistance is connected between the DC voltage source and the first node.

17. The drive device of claim 1, wherein:

the source comprises:

a signal generator controllable by the excitation signal;

a current or voltage source controllable by an output signal of the signal generator to output the time-dependent AC current signal; and a controllable voltage or current source and a coupling capacitance is connected between the voltage or current source and the first node.

18. The drive device of claim 1, wherein:

the source comprises:

a signal generator controllable by the excitation signal; and a current or voltage source controllable by an output signal of the signal generator to output the time-dependent AC current signal;

the drive device is configured to drive a plurality of capacitive actuators of the optical system; and an optical element of the optical system is assigned to a respective capacitive actuator.

19. An optical system, comprising:

a plurality actuatable optical elements, wherein, for each actuatable optical element:

the optical element is assigned a capacitive actuator;

each capacitive actuator is assigned a drive device to drive the capacitive actuator; and the drive device is a drive device according to claim 1.

20. An apparatus, comprising:

a plurality actuatable optical elements, wherein:

the apparatus is a lithography apparatus; and for each actuatable optical element:

the optical element is assigned a capacitive actuator;

each capacitive actuator is assigned a drive device to drive the capacitive actuator; and the drive device is a drive device according to claim 1.

* * * * *

UNITED STATES PATENT AND TRADEMARK OFFICE
CERTIFICATE OF CORRECTION

PATENT NO. : 12,276,916 B2
APPLICATION NO. : 17/961447
DATED : April 15, 2025
INVENTOR(S) : Michel Aliman et al.

It is certified that error appears in the above-identified patent and that said Letters Patent is hereby corrected as shown below:

In the Specification

Column 6, Line 19, after "apparatus" insert -- ; --.

Column 6, Line 57, delete "Rs, Cs and Ls," and insert -- $R_s$, $C_s$ and $L_s$, --.

Column 6, Lines 59-60, delete "$C_S$ and $L_S$." and insert -- $C_s$ and $L_s$. --.

Column 6, Line 61, delete "$L_S$" and insert -- $L_s$ --.

Column 8, Line 55, after "and" insert -- 160. --.

Column 8, Line 65, delete "(=$R_S$ $_0$" and insert -- (=$R_{s,0}$ --.

Column 11, Line 32, after "factor" insert -- ; --.

Signed and Sealed this
Twenty-seventh Day of May, 2025

Coke Morgan Stewart
*Acting Director of the United States Patent and Trademark Office*